(12) United States Patent
Lee

(10) Patent No.: US 8,254,205 B2
(45) Date of Patent: Aug. 28, 2012

(54) CIRCUIT AND METHOD FOR SHIFTING ADDRESS

(75) Inventor: Jong Chern Lee, Ichon-si (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 561 days.

(21) Appl. No.: 12/493,835

(22) Filed: Jun. 29, 2009

(65) Prior Publication Data

US 2010/0290306 A1   Nov. 18, 2010

(30) Foreign Application Priority Data

May 14, 2009  (KR) .................. 10-2009-0042045

(51) Int. Cl.
*G11C 19/00* (2006.01)
*G11C 8/00* (2006.01)
(52) U.S. Cl. .................. 365/240; 365/230.08
(58) Field of Classification Search .......... 365/240, 365/230.08, 233.1
See application file for complete search history.

(56) References Cited

U.S. PATENT DOCUMENTS

| | | | |
|---|---|---|---|
| 3,593,298 A * | 7/1971 | Armstrong ............ | 360/51 |
| 5,640,527 A | 6/1997 | Pecone et al. | |
| 5,996,059 A | 11/1999 | Porten et al. | |
| 6,185,629 B1 | 2/2001 | Simpson et al. | |
| 6,333,878 B2 * | 12/2001 | Ooishi ............ | 365/200 |
| 6,882,642 B1 | 4/2005 | Kejriwal et al. | |
| 7,027,344 B1 | 4/2006 | Oh | |
| 7,110,322 B2 | 9/2006 | Farmwald et al. | |
| 7,209,997 B2 | 4/2007 | Farmwald et al. | |
| 7,881,136 B2 * | 2/2011 | Kim ............ | 365/201 |

FOREIGN PATENT DOCUMENTS

| | | |
|---|---|---|
| JP | 2001-155488 A | 6/2001 |
| KR | 1020020043778 A | 6/2002 |

\* cited by examiner

*Primary Examiner* — Anh Phung
(74) *Attorney, Agent, or Firm* — Ladas & Parry LLP

(57) ABSTRACT

A circuit for shifting an address includes a shift cell block configured to sequentially shift address signals in response to shift control signals and a control cell block configured to generate the shift control signals for activating the shift cell block in a column unit using sequentially shifted read commands or write commands.

21 Claims, 5 Drawing Sheets

CIRCUIT AND METHOD FOR SHIFTING ADDRESS

CROSS-REFERENCES TO RELATED PATENT APPLICATION

The present application claims priority under 35 U.S.C 119(a) to Korean Application No. 10-2009-0042045, filed on May 14, 2009, in the Korean Intellectual Property Office, which is incorporated herein by reference in its entirety as set forth in full.

BACKGROUND OF THE INVENTION

The present invention relates generally to a semiconductor device and, more particularly, to a circuit and a method for shifting an address.

Semiconductor memory devices are provided with a circuit for shifting an input by a predetermined time from a clock signal CLK to fit to an operation timing of commands, such as a reading command or a write command.

FIG. 1 is a block diagram of a circuit for shifting an address 10 according to the related art.

As shown in FIG. 1, the circuit for shifting an address 10 according to the related art is composed of a plurality of flip-flops 11, which is a shift register structure.

The flip-flops 11 disposed at the foremost stage receive address signals A0~An in response to a reading command RD or a write command WT and the next flip-flops 11 output shifted address signals A0_n~An_n by sequentially shifting the address signals A0~An in response to a clock signal CLK.

FIG. 2 is a circuit diagram of the flip-flop 11 of FIG. 1.

As shown in FIG. 2, the flip-flop 11 can be composed of a plurality of inverters IV1~IV5 and a plurality of pass gates PG1, PG2.

The flip-flop 11 is configured to latch an input signal D in a low-level period of a clock signal CLK and output the latched signal as an output signal Q in a high-level period of the clock signal CLK. The flip-flop 11 has a 2-stage structure that operates in the low-level period and the high-level period of the clock signal CLK.

A conventional circuit for shifting an address with the above structure are problematic.

All of the flip-flops 11 in conventional circuits for shifting an address operate in response to a clock signal CLK. Therefore, in the address shifting operation, all the flip-flops 11 operate every time a clock signal CLK toggles (other than flip-flop that outputs an address signal fitting a timing for the actual operation), thereby causing unnecessary consumption of electric current.

As shown in FIG. 2, conventional circuits for shifting an address have the flip-flop 11 with a 2-stage structure that performs latching and outputting in the high-level period and a low-level period of a clock signal CLK, thereby increasing the circuit area.

SUMMARY OF THE INVENTION

Embodiments of the present invention are directed to a circuit and a method for shifting an address that make it possible to reduce consumption of electric current and the circuit area.

A circuit for shifting an address according to one embodiment includes: a shift cell configured to shift an address signal in response to a shift control signal and a control cell configured to generate the shift control signal for activating the shift cell using a read command or a write command.

A circuit for shifting an address according to another embodiment includes: a shift cell block configured to sequentially shift address signals in response to shift control signals and a control cell block configured to generate shift control signals for activating the shift cell block in a column unit using sequentially shifted read commands or write commands.

A circuit for shifting an address according to yet another embodiment includes: a shift cell block configured to include a plurality of shift cells, which is disposed in a matrix and commonly receives signal bits of shift control signals in a column unit, and shifts address signals when the signal bits of the shift control signals are activated; and a control cell block configured to include a plurality of control cells, which sequentially shifts read or write commands by using a clock signal, wherein only control cells receiving read commands or write commands activate the signal bits of the shift control signals.

A method for shifting an address according to an embodiment includes: command-shifting that sequentially shifts read or write commands in response to a clock signal and address-shifting which shifts addresses by sequentially activating shift cells in columns of a plurality of shift cells disposed in a matrix corresponding to the shifting timing of the read or write commands.

These and other features, aspects, and embodiments are described below in the section "Description of Specific Embodiments."

BRIEF DESCRIPTION OF THE DRAWINGS

Features, aspects, and embodiments are described in conjunction with the attached drawings, in which.

DESCRIPTION OF SPECIFIC EMBODIMENTS

Preferred embodiments are described hereafter in detail with reference to the accompanying drawings.

Figure 3:
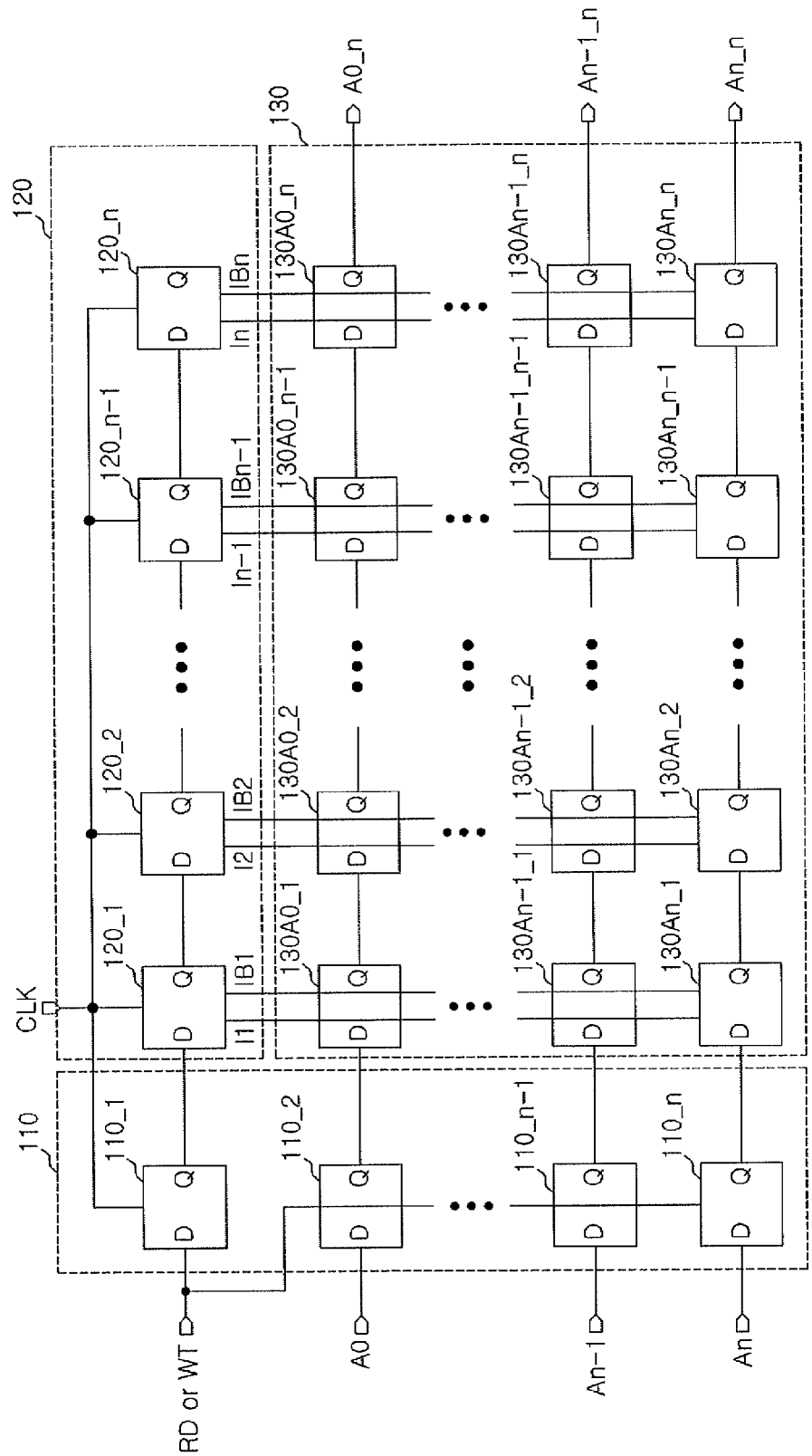
FIG. 3 is a block diagram of a circuit for shifting an address 100 according to an embodiment.

FIG. 3 is a block diagram of a circuit for shifting an address 100 according to an embodiment.

As shown in FIG. 3, the circuit for shifting an address 100 is configured to include an input cell block 110, a control cell block 120, and a shift cell block 130.

The input cell block 110 includes a plurality of input cells 110_1~110_n. The input cell block 110 receives a read command RD or a write command WT in response to a clock signal CLK and transmits it to the control cell block 120. The input cell block 110 also receives address signals A0~An in response to the read command RD or the write command WT and transmits them to the shift cell block 130.

In input cell block 110, the input cell 110_1 receives a read command RD or a write command WT in response to a clock signal CLK and transmits it to the control cell bock 120. Also in response to a read command RD or a write command WT, the input cells 110_2~110_n receive the address signals A0~An and transmit them to the shift cell block 130.

The control cell block 120 includes a plurality of control cells 120_1~120_n. The control cell block 120 sequentially shifts a read command RD or a write command WT in response to the clock signal CLK and generates shift control signals I<1:n>/IB<1:n> for controlling the shift operation of the shift cell block 130 in a column unit, using the sequentially shifted read commands RD or write commands WT.

The shift cell block 130 includes a plurality of shift cells 130A0_1~130An_n in a matrix. Activation of the shift operations of n shift cell groups in columns (shift cell group) 130A<0:n>_1~130A<0:n>_n is determined in accordance with the shift control signals I<1:n>/IB<1:n>. That is, an activation of the shift cell group 130A<0:n>_1 is determined in accordance with the shift control signal I1/IB1, and activation of the shift cell group 130A<0:n>_2 is determined in accordance with the shift control signal I2/IB2.

Figure 4:
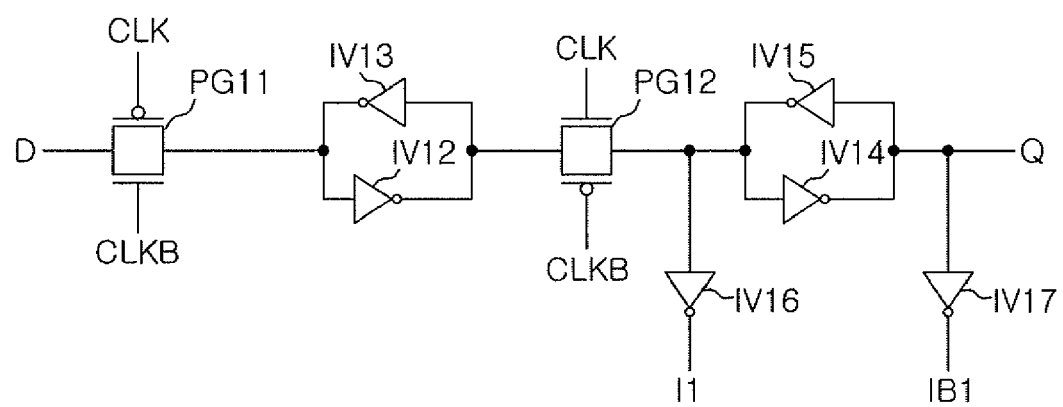
FIG. 4 is a circuit diagram of a control cell 120_1 of FIG. 3.

FIG. 4 is a circuit diagram of the control cell 120_1 of FIG. 3.

The plurality of control cells 120_1~120_n can have the same configuration. As shown in FIG. 4, the control cell 120_1 can be composed of a plurality of inverters IV11~IV17 and a plurality of pass gates PG11, PG12.

The control cell 120_1 receives a read command RD or a write command WT and latches it as an input signal D in the low-level period of a clock signal CLK. Further, the control cell 120_1 outputs the latched read command RD or write command WT as an output signal Q in the high-level period of the clock signal CLK and as the shift control signal I1/IB1.

Figure 5:
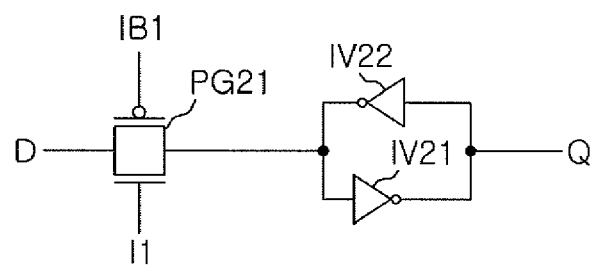
FIG. 5 is a circuit diagram of a shift cell 130A0_1 of FIG. 3.

FIG. 5 is a circuit diagram of the shift cell 130A0_1 of FIG. 3.

Figure 1:
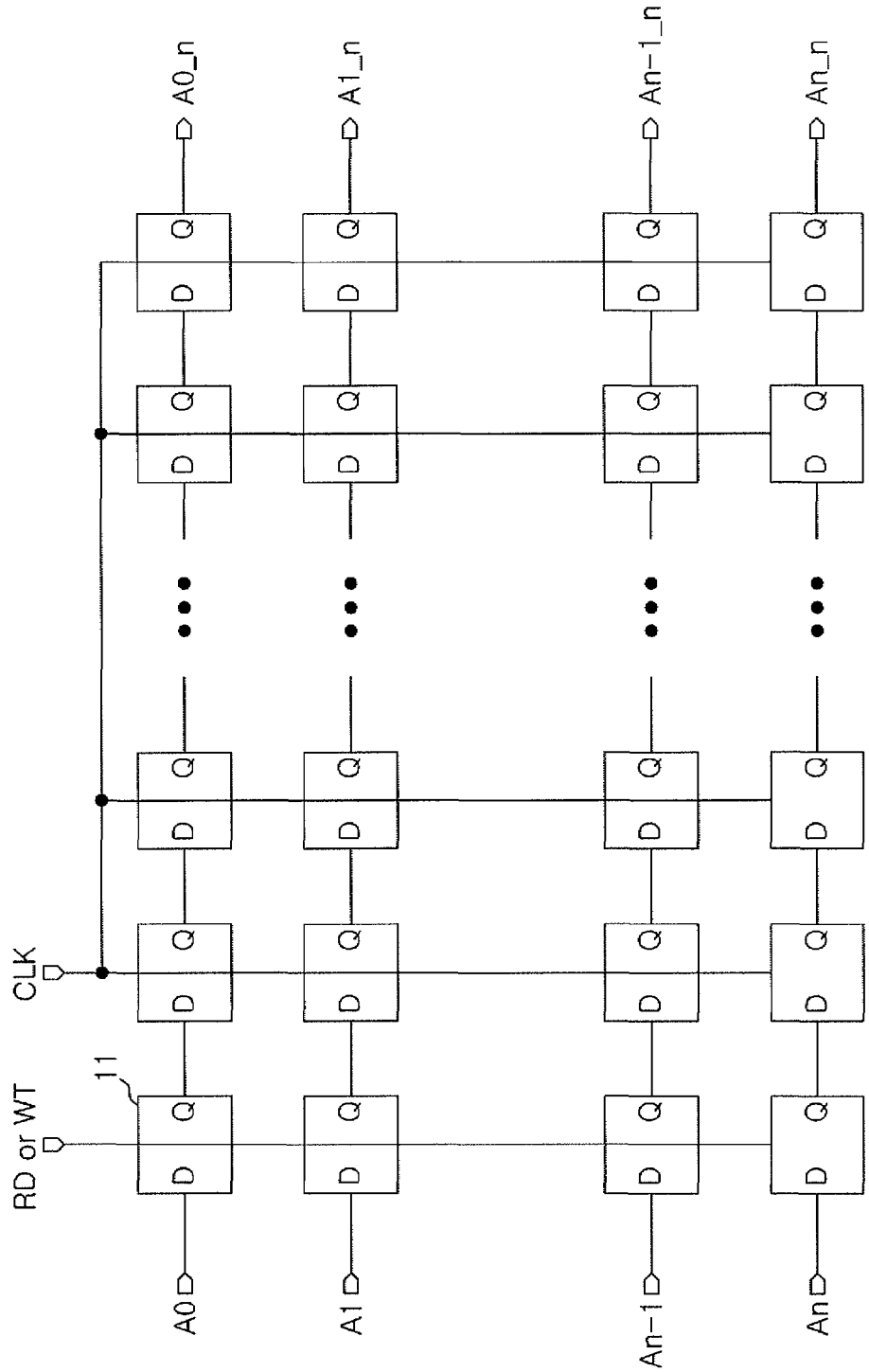
FIG. 1 is a block diagram of a circuit for shifting an address 10 according to the related art.
Figure 2:
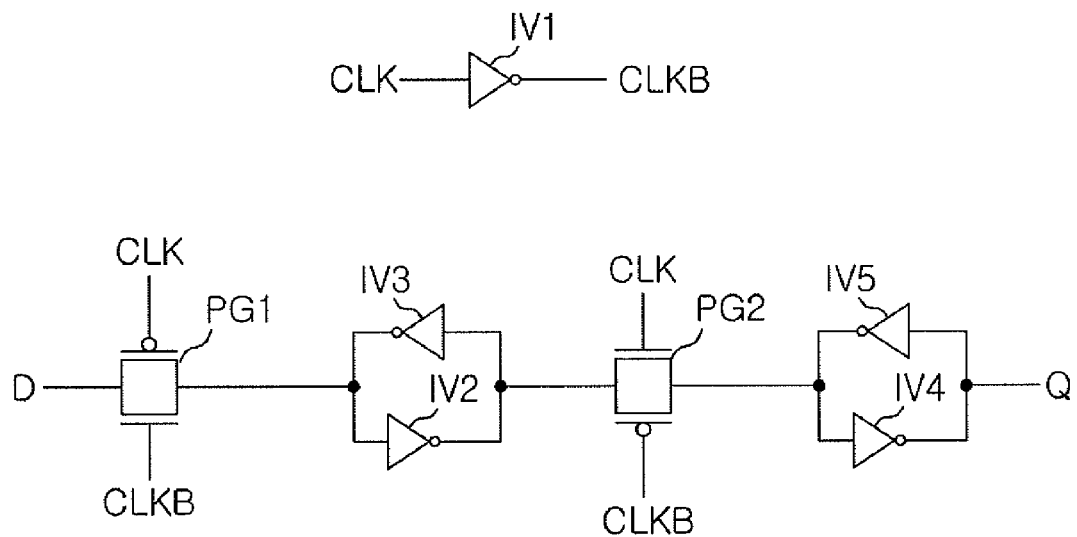
FIG. 2 is a circuit diagram of a flip-flop 11 of the related art of FIG. 1.

The plurality of shift cells 130A0_1~130An_n can have the same configuration. As shown in FIG. 5, the shift cell 130A0_1 can be composed of two inverters IV21, IV22 or only one pass gate PG21. It can be seen that the plurality of shift cells 130A0_1~130An_n according to an embodiment have a configuration performing the same operation according to the related art, i.e. a circuit configuration that is significantly simpler than the flip-flop 11 of FIG. 2.

Since the pass gate PG21 is turned on when the shift control signal I<1:n> transitions to a high level, the plurality of shift cells 130A0_1~130An_n latch the input signal D and transmit it to the next shift cell. For example, when the shift control signal I1 transitions to a high level, the shift cell 130A0_1 latches the address signal A0 latched as an input signal D in the input cell 110_2 and transmits it to the shift cell 130A0_2.

On the other hand, since the pass gate PG21 is turned off when the shift control signal I<1:n> is at a low level, electric current paths for the plurality of shift cells 130A0_1~130An_n are blocked.

A method for shifting an address having the above configuration according to an embodiment is described with reference to FIGS. 3 to 6 as follows.

Figure 6:
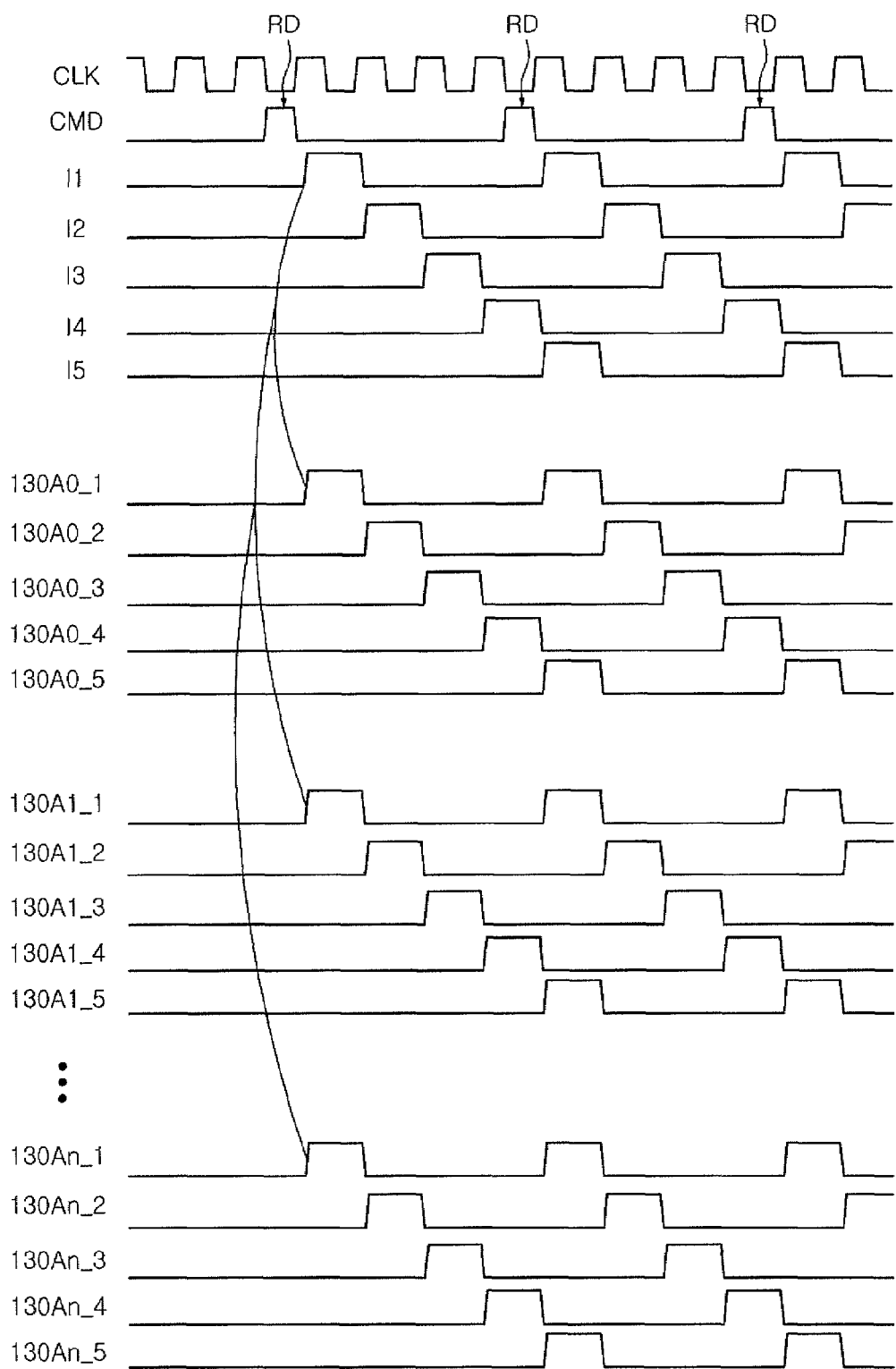
FIG. 6 is a diagram showing output waveforms of a circuit for shifting an address according to an embodiment.

FIG. 6 is a diagram showing waveforms of a circuit for shifting an address according to an embodiment.

When a read command RD is inputted, the input cell 110_1 of FIG. 3 latches the read command RD in response to a low-level clock signal CLK and transmits the read command RD to the control cell block 120 in response to a high-level clock signal CLK.

Further, the input cells 110_2~110_n transmit the address signals A0~An to the shift cell block 130 in response to the read command RD.

The control cell block 120 sequentially shifts the read command RD and sequentially activates the shift control signals I<1:n>/IB<1:n> in response to the sequentially shifted read commands RD. Thus, the activation timings of the shift control signals I<1:n>/IB<1:n> do not overlap each other. The shift control signal I<1:n> is activated to a high level and the shift control signal IB<1:n> is activated to a low level.

The n shift cells groups 130A<0:n>_1~130A<0:n>_n are sequentially activated in response to the sequentially activated shift control signals I<1:n>/IB<1:n>.

That is, the shift cell group 130A<0:n>_1 of the plurality of shift cells 130A0_1~130An_n is activated in response to the activated shift control signal I1/IB1. The shift cell groups 130A<0:n>_2~130A<0:n>_n that have received the inactivated shift control signals I<2:n>/IB<2:n> are inactivated. Since the shift is control signal I<2:n> is at a low level, the pass gate PG21 is turned off and electric current paths for all shift cells of the inactivated shift cell groups 130A<0:n>_2~130A<0:n>_n are blocked.

Further, the shift cell group 130A<0:n>_2 is activated in response to the shift control signal I2/IB2 that is activated next to the shift control signal I1/IB1. Thus, all of the shift cell groups 130A<0:n>_1~130A<0:n>_n are sequentially activated.

The address signals A0~An transmitted through the input cells 110_2~110_n are shifted in the order of activated shift cell groups 130A<0:n>_1~130A<0:n>_n.

That is, the activated shift cell group 130A<0:n>_1 transmits the address signals A0~An, which are outputted from the input cells 110_2~110_n, to the shift cell group 130A<0:n>_2 at the next stage, and the shift cell group 130A<0:n>_2 transmits the address signals A0~An to the shift cell group 130A<0:n>_3 at the next stage. In this way, the address signals A0~An are sequentially shifted through the entire shift cell groups 130A<0:n>_1~130A<0:n>_n.

In this embodiment, only the control cells where a read command RD or a write command WT is transmitted in the control cell block 120 activate and output the shift control signals I<1:n>/IB<1:n>. Further, all the shift cells 130A0_1~130An_n of the shift cell block 130 operate not in response to a clock signal CLK that periodically transitions regardless of a read command RD or a write command WT, but the shift control signals I<1:n>/IB<1:n>.

Accordingly, only the shift cell groups where the activated shift control signals I<1:n>/IB<1:n> are inputted perform the address shifting operation.

That is, when the shift control signal I1/IB1 is activated, only the shift cell group 130A<0:n>_1 transmits the address signals A0~An to the shift cell group 130A<0:n>_2 at the next stage, whereas the other shift cell groups 130A<0:n>_2~130A<0:n>_n do not operate.

The consumption of electric current can be considerably reduced because shift cell groups only operate when address shifting, rather than operating in response to a clock signal.

Further, since all the shift cells 130A0_1~130An_n only transmit the address signals A0~An to the next stage in response to the shift control signal I<1:n>/IB<1:n>, as shown in FIG. 5, the area can be reduced by half because they occupy most of the area of the circuit for shifting an address.

While certain embodiments are described above, it is understood that the embodiments described are by way of example only. Accordingly, the device and method described herein are limited by the described embodiments. Rather, the devices and methods described herein are only limited in light of the claims that follow when taken in conjunction with the above description and accompanying drawings.

What is claimed is:

1. A circuit for shifting an address comprising:
   a shift cell block configured to sequentially shift address signals in response to shift control signals; and
   a control cell block configured to generate the shift control signals for activating a column unit of the shift cell block using sequentially shifted read commands or write commands.

2. The circuit for shifting an address according to claim 1, further comprising:
   an input cell block configured to transmit the read commands or the write commands to the control cell block and to transmit the address signals to the shift cell block.

3. The circuit for shifting an address according to claim 2, wherein the input cell block comprises:
   a first input cell configured to transmit the read commands or the write commands to the control cell block in response to a clock signal; and
   a plurality of second input cells configured to transmit the address signals to the shift cell block in response to the read commands or the write commands.

4. The circuit for shifting an address according to claim 1, wherein the shift cell block includes a plurality of shift cells disposed in a matrix, and the shift cells in the column unit are simultaneously activated in response to activated shift control signals.

5. The circuit for shifting an address according to claim 1, wherein the shift cell block includes a plurality of shift cells disposed in a matrix, and electric current paths of the shift cells in the column unit are blocked in response to inactivated shift control signals.

6. The circuit for shifting an address according to claim 4, wherein the shift cell comprises:
   a transmitting element configured to pass a signal bit of the address signals in response to a signal bit of the shift control signals; and
   a latch configured to latch an output of the transmitting element.

7. The circuit for shifting an address according to claim 1, wherein the control cell block includes a plurality of control cells, and
   the control cells sequentially shift the read commands or the write commands in response to a clock signal, and sequentially activate the bits of the shift control signals in response to the sequentially shifted read commands or write commands.

8. The circuit for shifting an address according to claim 7, wherein the control cell comprises:
   a first transmitting element configured to pass the read commands or the write commands in response to the clock signal;
   a first latch configured to latch an output of the first transmitting element;
   a second transmitting element configured to pass an output of the first latch in response to the clock signal; and
   a second latch configured to latch an output of the second transmitting element,
   wherein the output of the second transmitting element is outputted as a signal bit of the shift control signals and the output of the second latch is outputted as the shifted read command or write command.

9. A circuit for shifting an address comprising:
   a shift cell block configured to include a plurality of shift cells disposed in a matrix that commonly receive signal bits of shift control signals in a column unit, wherein the column unit shifts address signals when the signal bits of the shift control signals are activated; and
   a control cell block configured to include a plurality of control cells, which sequentially shift read commands or write commands by using a clock signal, wherein only the control cells receiving the read commands or the write commands activate the signal bits of the shift control signals.

10. The circuit for shifting an address according to claim 9, further comprising:
    an input cell block configured to transmit the read commands or the write commands to the control cell block and to transmit the address signals to the shift cell block.

11. The circuit for shifting an address according to claim 10, wherein the input cell block includes:
    a first input cell configured to transmit the read commands or the write commands to the control cell block in response to the clock signal; and
    a plurality of second input cell configured to transmit the address signals to the shift cell block in response to the read commands or the write commands.

12. The circuit for shifting an address according to claim 9, wherein electric current paths of the plurality of shift cells are blocked in response to inactivated signal bits of the shift control signals in the shift cell block.

13. The circuit for shifting an address according to claim 9, wherein the shift cell comprises:
    a transmitting element configured to pass the address signals in response to a signal bit of the shift control signals; and
    a latch configured to latch an output of the transmitting element.

14. The circuit for shifting an address according to claim 9, wherein the control cell comprises:
    a first transmitting element configured to pass the read commands or the write commands in response to the clock signal;
    a first latch configured to latch an output of the first transmitting element;
    a second transmitting element configured to pass an output of the first latch in response to the clock signal; and
    a second latch configured to latch an output of the second transmitting element,
    wherein the output of the second transmitting element is outputted as a signal bit of the shift control signals and the output of the second latch is outputted as the shifted read command or write command.

15. A method for shifting an address comprising:
    command-shifting that sequentially shifts read commands or write commands in response to a clock signal; and
    address-shifting that shifts addresses by sequentially activating shift cells in column units of a plurality of shift cells disposed in a matrix corresponding to the shifted timing of the read commands or the write commands.

16. The method for shifting an address according to claim 15, wherein electric current paths of inactivated shift cells of the plurality of shift cells are blocked in the address-shifting.

17. A circuit for shifting an address comprising:
    a shift cell configured to shift an address signal in response to a shift control signal; and
    a control cell configured to generate the shift control signal for activating the shift cell using a read command or a write command:
    an input cell block configured to transmit the read command or the write command to the control cell and to transmit the address signal to the shift cell.

18. The circuit for shifting an address according to claim 17, wherein the input cell block comprises:

a first input cell configured to transmit the read command or the write command to the control cell in response to a clock signal; and a second input cell configured to transmit the address signal to the shift cell in response to the read command or the write command.

19. The circuit for shifting an address according to claim 17, wherein the electric current path of the shift cell is blocked in response to an inactivated shift control signal.

20. The circuit for shifting an address according to claim 19, wherein the shift cell comprises:

a transmitting element configured to pass the address signal in response to the shift control signal; and a latch configured to latch an output of the transmitting element.

21. The circuit for shifting an address according to claim 17, wherein the control cell comprises:

a first transmitting element configured to pass the read command or the write command in response to the clock signal;

a first latch configured to latch an output of the first transmitting element;

a second transmitting element configured to pass an output of the first latch in response to the clock signal; and a second latch configured to latch an output of the second transmitting element, wherein the output of the second transmitting element is outputted as the shift control signal and the output of the second latch is outputted as the shifted read command or write command.

* * * * *